United States Patent [19]
Yamamoto

[11] Patent Number: 5,900,735
[45] Date of Patent: May 4, 1999

[54] DEVICE FOR EVALUATING RELIABILITY OF INTERCONNECT WIRES

[75] Inventor: Shigehisa Yamamoto, Tokyo, Japan

[73] Assignee: Mitsubishi Denki Kabushiki Kaisha, Tokyo, Japan

[21] Appl. No.: 08/807,751

[22] Filed: Feb. 27, 1997

[30] Foreign Application Priority Data

Oct. 31, 1996 [JP] Japan .................................. 8-289841

[51] Int. Cl.⁶ ......................... G01R 31/02; H01L 23/528
[52] U.S. Cl. ...................... 324/537; 324/158.1; 257/758
[58] Field of Search ................... 324/716, 719, 324/537, 538, 158.1, 765; 257/734, 758, 767, 773, 774, 775, 776, 920

[56] References Cited

U.S. PATENT DOCUMENTS

| | | | |
|---|---|---|---|
| 4,652,812 | 3/1987 | Gimpelson et al. | 324/719 |
| 5,049,811 | 9/1991 | Dreyer et al. | 324/537 |
| 5,382,831 | 1/1995 | Atakov et al. | 257/767 |
| 5,514,974 | 5/1996 | Bouldin | 324/158.1 |
| 5,612,627 | 3/1997 | Bui et al. | 324/716 |
| 5,689,139 | 11/1997 | Bui et al. | 257/767 |
| 5,712,510 | 1/1998 | Bui et al. | 257/767 |

FOREIGN PATENT DOCUMENTS 7-115118  5/1995  Japan .

OTHER PUBLICATIONS

I. A. Blech, "Electromigration In Thin Aluminum Films On Titanium Nitride", Journal Of Applied Physics, vol. 47, No. 4, Apr. 1976, pp. 1203–1208.

*Primary Examiner*—Diep N. Do
*Attorney, Agent, or Firm*—Oblon, Spivak, McClelland, Maier & Neustadt, P.C.

[57] ABSTRACT

Center-to-center spacings ($L_1$, $L_2$, $L_3$, $L_4$, . . . ) of adjacent holes (5) in a hole chain (6) are set to values not less than five times a Blech length. This setting causes two parameters (MTF and $\sigma$) of a logarithmic normal distribution used as a failure distribution for EM lifetime prediction to be constant independently of the center-to-center spacings, permitting stable EM lifetime prediction of the hole chain. Further, setting the length of each of extension interconnect wires (2) to a value not greater than the Blech length prevents voids from being created in the extension interconnect wires (2).

12 Claims, 13 Drawing Sheets

CRITICAL INTERCONNECT
WIRE LENGTH
(BLECH LENGTH)

F I G. 1 5
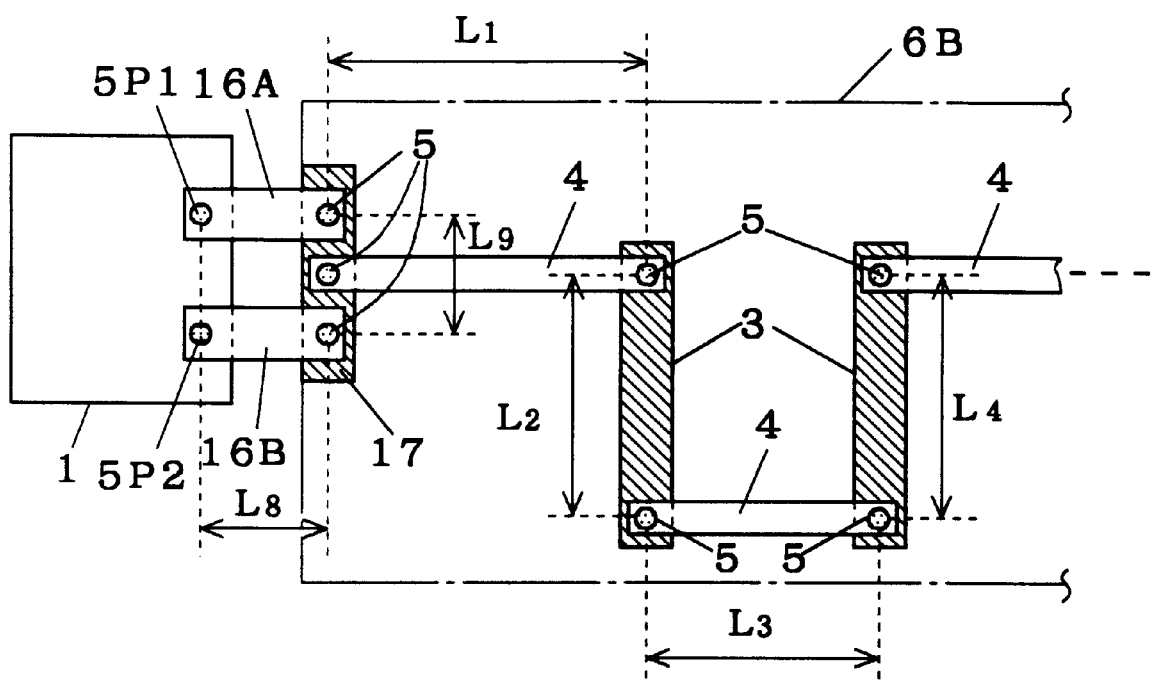

DEVICE FOR EVALUATING RELIABILITY OF INTERCONNECT WIRES

BACKGROUND OF THE INVENTION

1. Field of the Invention

The present invention relates to a device for evaluating the reliability of interconnect wires for use in semiconductor devices and, more particularly, to a reliability evaluation technique suitable for lifetime evaluation of interconnect wires due to electromigration (referred to hereinafter as EM) failures.

2. Description of the Background Art

Conventionally, an evaluation TEG (test element group) is widely used for evaluating the reliability of holes such as contact holes and via holes used for interconnection of semiconductor devices. The TEG is constructed such that a hole chain, a pad, and an extension interconnect wire for connecting the pad and the hole chain are formed on an Si substrate.

The conventional evaluation TEG, however, has a situation in which it is difficult to say that the structures of the hole chain and extension interconnect wire are sufficiently optimized for a failure mode. This creates voids resulting from the EM in portions which are not to be evaluated such as a portion of the extension interconnect wire and a portion adjacent a hole connected to the extension interconnect wire portion, not in a portion of the hole chain which is desired to be evaluated, resulting in interconnect wire failure. For example, a hole-to-hole spacing of the hole chain which is as short as several micrometers might result in creation of voids in a portion of the extension interconnect wire provided for establishing a connection between one end of the hole chain and the pad, not in a portion of the hole chain, and accordingly the occurrence of the EM failure.

The voids in the portion which is not to be evaluated cause the EM lifetime of the hole chain to be overestimated or underestimated. It is hence necessary to prevent the creation of such voids.

The predicted value of the EM failure lifetime varies in some cases depending on the establishment of the structure of the hole chain itself. This causes difficulty in stable prediction of the EM lifetime.

Due to these various factors, the reliability evaluation in an EM failure mode using the conventional evaluation TEG fails to exactly predict the EM lifetime.

The above described problems are considered to result from the fact that the structure of the interconnect wires has not been optimized for the evaluation in the EM failure mode. Thus, similar problems are considered to arise in evaluation in other failure modes when a test structure is not optimized in relation to the modes.

SUMMARY OF THE INVENTION

According to a first aspect of the present invention, a device for evaluating reliability of interconnect wires comprises: a substrate; an insulating film formed on the substrate; and a hole chain formed in the insulating film and comprising a plurality of holes electrically connected in sequential order, wherein a center-to-center distance between two of the holes which are adjacent to each other is not less than a length which is x times a Blech length where x is a rational number greater than 1, and wherein the length which is x times the Blech length corresponds to one value falling within the range of hole-to-hole spacings when all parameters of a predetermined failure distribution used for lifetime estimation of the hole chain in a predetermined failure mode and indicated in the form of a function using the hole-to-hole spacings as variables are determined independently of the hole-to-hole spacings.

Each of the hole-to-hole spacings is set to the value not less than X times the Blech length, or a critical interconnect wire length (X>1). Then, all of the parameters of the predetermined failure distribution are determined independently of the set values of the hole-to-hole spacings. Thus, the common parameters of the predetermined failure distribution are used for the respective hole-to-hole spacings of the hole chain.

Preferably, according to a second aspect of the present invention, in the device of the first aspect, the predetermined failure mode corresponds to an electromigration failure.

Specifically, for EM failure lifetime prediction, the logarithmic normal distribution or Weibull distribution is used as a failure distribution or a failure density function to achieve stable and exact EM lifetime prediction.

Preferably, according to a third aspect of the present invention, in the device of the second aspect, the predetermined failure distribution is a logarithmic normal distribution; and the center-to-center distances between the holes of the hole chain are not less than five times the Blech length.

When the hole-to-hole spacings of the hole chain are set to not less than five times the Blech length, the two parameters, MTF (median time to failure) and standard deviation $\sigma$, of the logarithmic normal distribution for use in the EM failure lifetime prediction are substantially constant independently of the set values of the hole-to-hole spacings. This provides stable EM lifetime prediction.

According to a fourth aspect of the present invention, a device for evaluating reliability of interconnect wires comprises: a substrate; an insulating film formed on the substrate; a pad formed in the insulating film and partially exposed; a hole chain formed in the insulating film and comprising a plurality of holes electrically connected in sequential order; and an extension interconnect wire formed in the insulating film for establishing an electrical connection between the pad and a first end of the hole chain which is adjacent the pad, wherein the length of the extension interconnect wire is not greater than a Blech length.

When the length of the extension interconnect wire is set to the Blech length, saturated are the movement of metal atoms constituting the extension interconnect wire in the extension interconnect wire due to the stress current, and the backflow due to the internal stress caused by the movement of the metal atoms to the first end of the hole chain. When the length of the extension interconnect wire is set to less than the Blech length, the internal stress constantly exceeds the metal atom movement, preventing voids from being created in the extension interconnect wire.

Preferably, according to a fifth aspect of the present invention, the device of the fourth aspect further comprises: a resistance measuring monitor terminal formed in the insulating film and partially exposed, the resistance measuring monitor terminal being connected to the extension interconnect wire.

The length of the extension interconnect wire is set to the value not greater than the Blech length, suppressing the creation of the voids. Thus, if the resistance measuring monitor terminal is connected to the extension interconnect wire, the atoms constituting the interconnect wire are not fed from the connecting portion into the extension interconnect wire. Therefore, new voids are not created in a portion of the extension interconnect wire.

Preferably, according to a sixth aspect of the present invention, in the device of the fourth aspect, the extension interconnect wire corresponds to a first extension interconnect wire, and the device further comprises a second extension interconnect wire formed in the insulating film for establishing an electrical connection between the pad and the first end of the hole chain, the second extension interconnect wire having a length which is not greater than the Blech length.

Since the lengths of the plurality of extension interconnect wires are set to not greater than the Blech length, no voids are created in the extension interconnect wires. If twice the stress current which may flow in only one extension interconnect wire is applied to the pad, the EM failure is prevented from occurring in the extension interconnect wire portion.

Preferably, according to a seventh aspect of the present invention, the device of the sixth aspect further comprises: a resistance measuring monitor terminal formed in the insulating film and partially exposed, the resistance measuring monitor terminal being connected to the first extension interconnect wire.

The length of the extension interconnect wire is set to the value not greater than the Blech length, suppressing the creation of the voids. Thus, if the resistance measuring monitor terminal is connected to the extension interconnect wire, the atoms constituting the interconnect wire are not fed from the connecting portion into the extension interconnect wire. Therefore, new voids are not created in a portion of the extension interconnect wire.

Preferably, according to an eighth aspect of the present invention, in the device of the sixth aspect, the first end of the hole chain comprises first, second, and third holes electrically connected to each other; a center-to-center spacing between the first and third holes is not greater than the Blech length; the first and third holes are electrically connected to the first and second extension interconnect wires, respectively; and the second hole is electrically connected to other ones of the plurality of holes constituting the hole chain in sequential order.

Preferably, according to a ninth aspect of the present invention, in the device of the fourth aspect, the pad comprises: a pad portion receiving a stress current from the exterior; and an extension interconnect wire portion extending from a part of the pad portion and electrically connected to a first end of the extension interconnect wire which is adjacent the pad, and the extension interconnect wire portion has a width set so that an electromigration failure is not caused due to the stress current.

Preferably, according to a tenth aspect of the present invention, in the device of the sixth aspect, the pad comprises: a pad portion receiving a stress current from the exterior; and an extension interconnect wire portion extending from a part of the pad portion and electrically connected to respective first ends of the first and second extension interconnect wires which are adjacent the pad, and the extension interconnect wire portion has a width set so that an electromigration failure is not caused due to the stress current.

In the device of the ninth and tenth aspects of the present invention, the pad takes a large share in area. Dividing the pad into the pad portion directly receiving the stress current and the extension interconnect wire portion extending from the pad portion toward one end of at least one extension interconnect wire of the hole chain allows a plurality of hole chains to share the pad portion taking the large share in area.

Preferably, according to an eleventh aspect of the present invention, in the device of the fourth aspect, a center-to-center spacing between adjacent ones of the holes of the hole chain is not less than five times the Blech length.

The EM failure is prevented from occurring in a portion of the extension interconnect wire which is not to be evaluated, and the stable EM failure lifetime prediction is permitted in the hole chain portion.

According to a twelfth aspect of the present invention, a device for evaluating reliability of interconnect wires comprises: a substrate; an insulating film formed on the substrate; a hole chain formed in the insulating film and comprising a plurality of holes electrically connected in sequential order; a pad; and an extension interconnect wire for establishing an electrical connection between the pad and a first end of the hole chain which is adjacent the pad, wherein the length of the extension interconnect wire is not greater than a Blech length, and wherein a center-to-center spacing between adjacent ones of the holes is greater than the Blech length.

In accordance with the first to third aspects of the present invention, the hole-to-hole spacings of the hole chain are set to not less than X times the Blech length. This achieves the reliability evaluation device which is capable of exactly and stably predicting the interconnect wire lifetime in the predetermined failure mode during the actual evaluation in the design stage of the hole chain.

In particular, the second aspect of the present invention is applied to the electromigration failure as the predetermined failure mode. This provides the reliability evaluation device which is capable of exactly and stably predicting the lifetime for the electromigration (EM) failure.

Particularly, in the third aspect of the present invention, the hole-to-hole spacings of the hole chain are set to not less than five times the Blech length. Thus, the EM lifetime may be accurately predicted using the logarithmic normal distribution independently of the set values of the hole-to-hole spacings of the hole chain portion.

In accordance with the fourth to tenth aspects and twelfth aspect of the present invention, the length of the extension interconnect wire is set to not greater than the Blech length. This completely prevents estimation errors of the lifetime due to the EM failure in the extension interconnect wire portion and permits the EM lifetime prediction in the hole chain which is to be originally evaluated. Therefore, exact reliability evaluation may be accomplished.

Additionally, in the sixth aspect of the present invention, the provision of the second extension interconnect wire which is similar in construction to the first extension interconnect wire allows the reliability evaluation under high stress current conditions while the exactness of the EM lifetime prediction when one extension interconnect wire is provided is maintained.

In accordance with the fifth and seventh aspects of the present invention, the resistance measuring monitor terminal connected to the extension interconnect wire prevents the overestimate of the EM lifetime. The resistance measuring monitor terminal may be connected to the extension interconnect wire while the exactness of the EM lifetime prediction is maintained.

Further, in the ninth aspect of the present invention, the pad comprises the pad portion and the extension interconnect wire portion. This permits highly flexible layout design while maintaining the exactness of the EM lifetime prediction.

In the tenth aspect of the present invention, the pad comprises the pad portion and the extension interconnect wire portion. This permits the EM lifetime evaluation under high stress current conditions while maintaining the exactness of the EM lifetime prediction as well as permitting the highly flexible layout establishment.

In the eleventh aspect of the present invention, the hole-to-hole spacings of the hole chain are set to not less than five times the Blech length. This achieves stable and exact EM lifetime prediction independently of the values of the hole-to-hole spacings in addition to the effects of the fourth to tenth aspects of the present invention.

It is therefore a primary object of the present invention to provide stable lifetime evaluation in a predetermined failure mode such as an EM failure mode independently of the establishment of the structure of a hole chain itself.

It is another object of the present invention to prevent an EM failure from occurring in a portion of an extension interconnect wire to exactly estimate the lifetime of a hole chain which is to be originally estimated.

It is still another object of the present invention to exert no influence of a resistance monitoring pad upon lifetime prediction.

It is a further object of the present invention to enable stable EM failure evaluation under high stress current conditions.

It is a still further object of the present invention to accomplish a test structure which permits highly flexible layout design.

These and other objects, features, aspects and advantages of the present invention will become more apparent from the following detailed description of the present invention when taken in conjunction with the accompanying drawings.

BRIEF DESCRIPTION OF THE DRAWINGS

FIG. 15 is a schematic plan view of a modification of the test structure of the fifth preferred embodiment.

DESCRIPTION OF THE PREFERRED EMBODIMENTS

Specific forms of a device for evaluating the reliability of interconnect wires will now be described according to first to seventh preferred embodiments of the present invention. The reliability evaluation device for interconnect wires is also known as a test structure or an evaluation TEG (test element group). In the following description, the reliability evaluation device for interconnect wires is referred to as a test structure.

The test structure generally comprises a hole chain as the nucleus, pads, and extension interconnect wires for connecting the hole chain and the corresponding pad. Among the above described elements, the test structure of the present invention is characterized in that (1) the structure of the hole chain is specified, (2) the structure of each of the extension interconnect wires is specified, and (3) improvements are made to the structure of at least one of the pads.

Using classification according to the preferred embodiments, the first preferred embodiment achieves the characteristic (1) whose object is to accomplish stable and exact lifetime prediction independently of the establishment of the structure of the hole chain. The second to seventh preferred embodiments achieve the characteristic (2) whose object is to preclude the occurrence of a predetermined failure mode in extension interconnect wires which are not to be evaluated to prevent the lifetime from being overestimated or underestimated. The fourth and seventh preferred embodiments additionally achieve the characteristic (3).

An electromigration failure (referred to hereinafter as an EM failure) is discussed hereinafter as a typical predetermined failure mode.

(First Preferred Embodiment)

A logarithmic normal distribution is used herein as a failure distribution for EM lifetime prediction.

Figure 1:
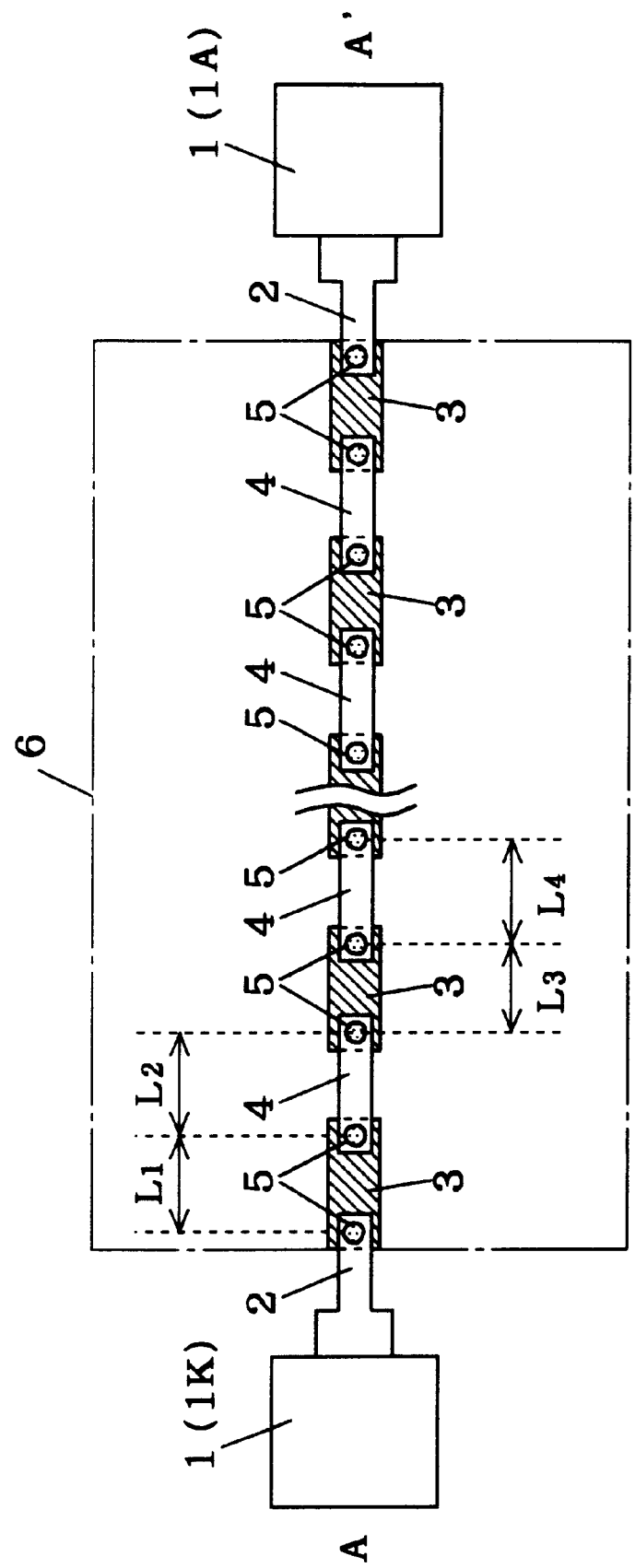
FIG. 1 is a plan view of a test structure according to a first preferred embodiment of the present invention.
Figure 2:
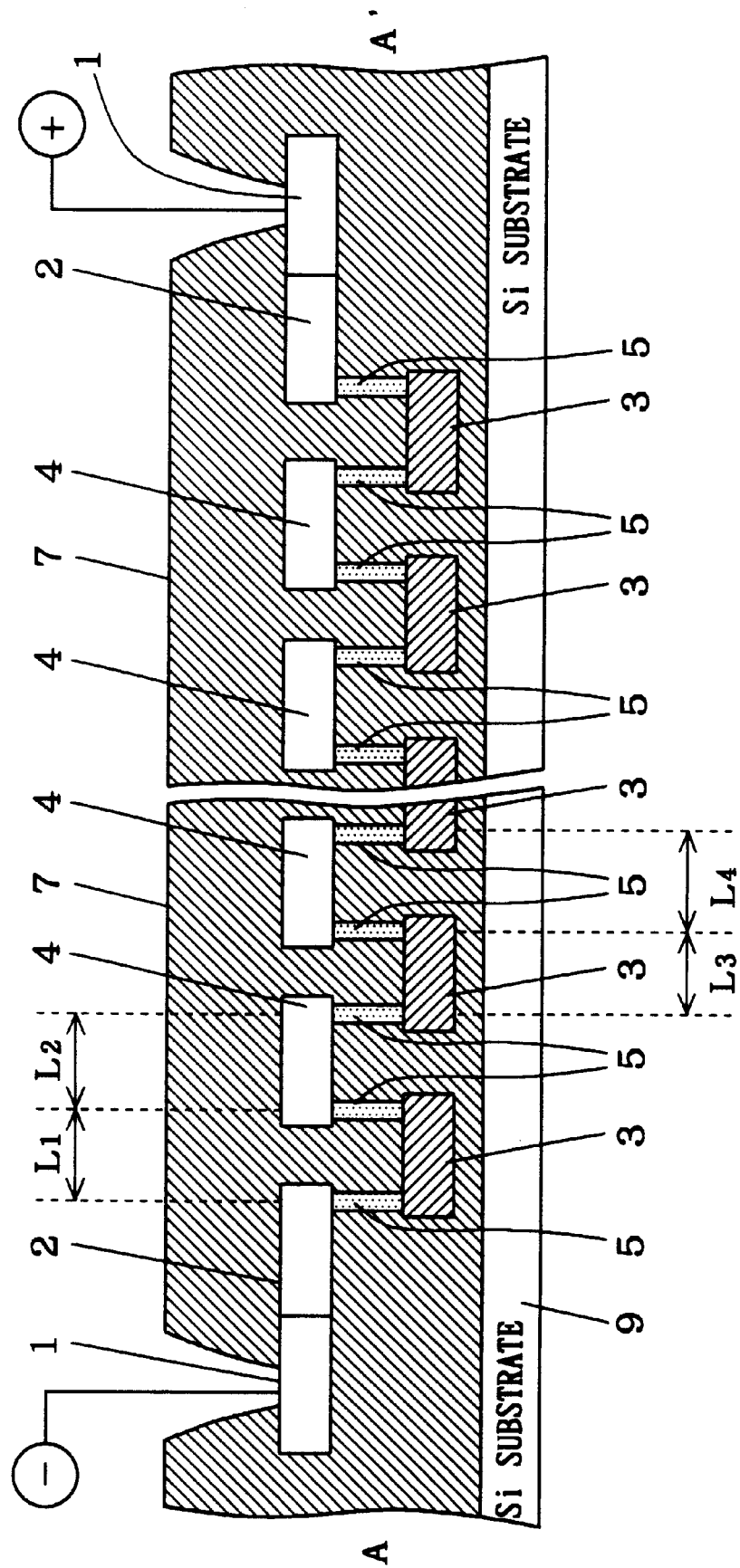
FIG. 2 is a cross-sectional view taken along the line A–A' of FIG. 1.
Figure 3A:
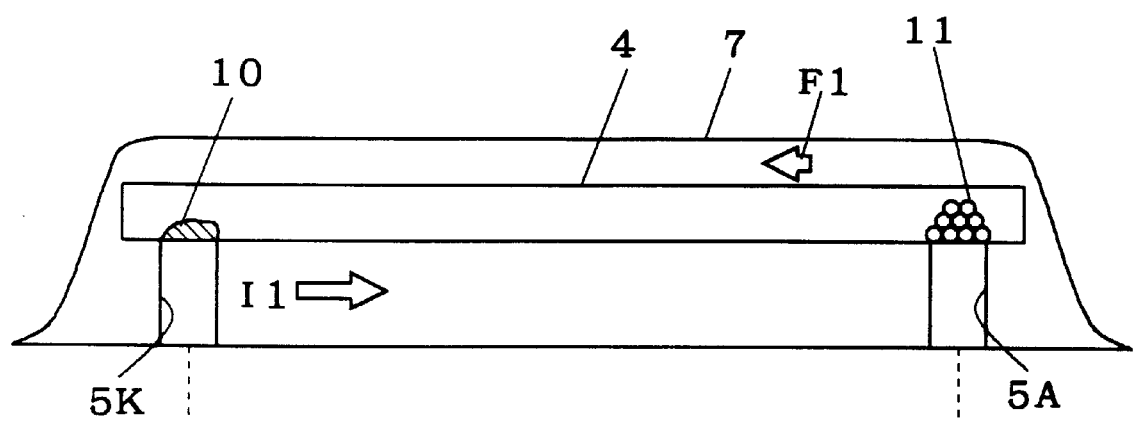
FIGS. 3A, 3B, 4A, and 4B schematically illustrate a Blech length concept.
Figure 3B:
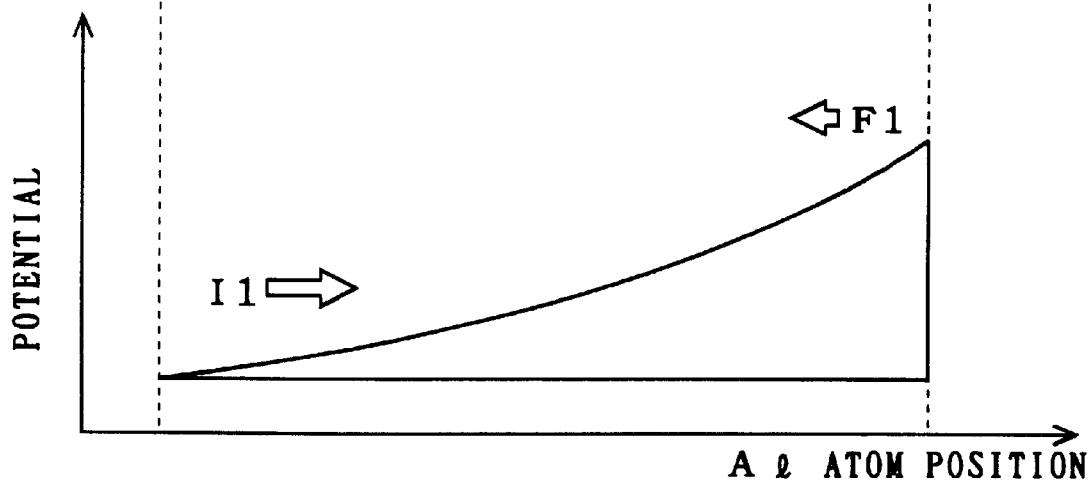
Figure 4A:
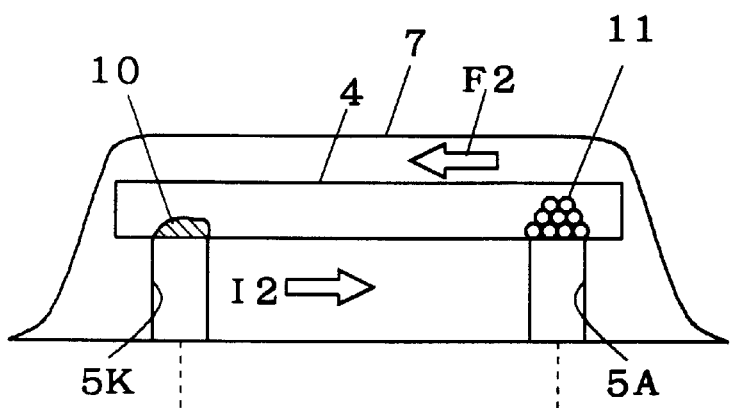
Figure 4B:
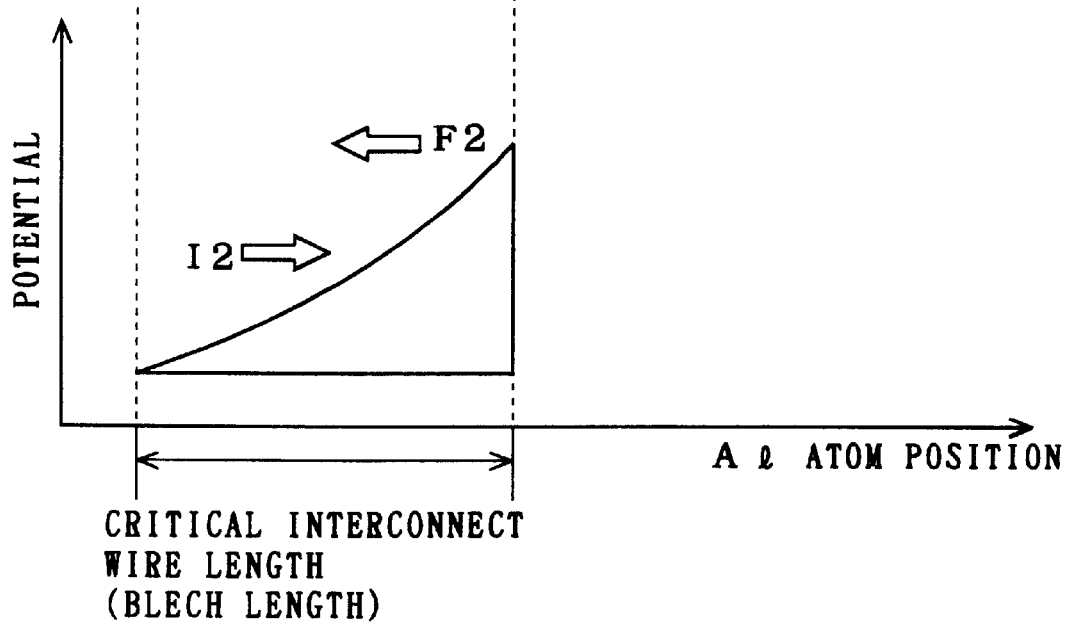

FIG. 1 is a schematic plan view of a test structure according to the first preferred embodiment of the present invention. For ease of understanding, an insulating film to be described later is not illustrated in FIG. 1. FIG. 2 is a longitudinal cross-sectional view taken along the line A–A' of FIG. 1.

Referring to FIGS. 1 and 2, the test structure is formed on a first major surface of a silicon substrate (or a semiconductor substrate) and comprises a hole chain 6, two stress applying pads 1, two extension interconnect wires 2, and an insulating film 7 (silicon oxide film or silicon nitride film) for entirely covering the hole chain 6 and the extension interconnect wires 2 and for partially covering the pads 1.

The stress applying pads 1 are connected to an external current source and receive a stress current to be applied when EM failure evaluation is performed on interconnect wires. Among the two pads 1, a left-hand pad 1K and a right-hand pad 1A of FIG. 1 are connected to a cathode and an anode of the external current source, respectively.

Each of the extension interconnect wires 2 extending from a corresponding one of the pads 1 establishes an electrical connection between one end of the hole chain 6

(corresponding to holes 5 positioned leftmost and rightmost of FIG. 1) and a part of the corresponding pad 1. In the first preferred embodiment, the extension interconnect wires 2 may be of any size and of any length.

The hole chain 6 includes a plurality of holes 5 arranged and connected in the form of a chain through lower aluminum interconnect wires (first aluminum interconnect wires) 3 and upper aluminum interconnect wires (second aluminum interconnect wires) 4, and is subjected to the EM failure evaluation. The holes 5 correspond to "via holes" if they make a connection between an Al layer and an Al layer in an actual semiconductor device, and correspond to "contact holes" if they make a connection between an Si layer and an Al layer in the actual semiconductor device. The holes 5 comprises plugs of tungsten and the like which is different from the material of the interconnect wires.

The center-to-center spacings of adjacent holes 5, or hole-to-hole spacings $L_1, L_2, L_3, L_4, \ldots$, are not necessarily equal but generally different from each other. The hole-to-hole spacings $L_1, L_2, L_3, L_4, \ldots$ are set under a limitation such that each of the hole-to-hole spacings $L_1, L_2, L_3, L_4, \ldots$ is not less than five times "a critical interconnect wire length" or "Blech length". This is the primary feature of the present invention. The reason or viewpoint why such a structure is used results from technical concepts to be described below.

The movement of Al atoms in the hole chain employing the tungsten plug and the like is determined by (1) the movement of Al atoms caused by stress current, and (2) a backflow effect caused by the internal stress created in the hole portion 5 adjacent the anode to which the Al atoms move. The "backflow" means such a phenomenon that the Al atoms are moved in the direction opposite to the direction of the Al atom movement (1) (forward direction). The backflow effect increases as the length of an interconnect wire for connecting adjacent holes (the length of the first or second Al interconnect wires 3, 4 corresponding to the hole-to-hole spacing) decreases. As the interconnect wire length decreases under given stress current conditions, the effects of movement of Al atoms in the opposite directions cancel each other when a certain length value is reached. If the interconnect wire length is further decreased from the certain length value, the backflow effect prevails and the EM failure no longer occurs. The length of the Al interconnect wire for connecting the holes at this time is defined as the "critical interconnect wire length" or "Blech length", which will be schematically illustrated in FIGS. 3A, 3B, 4A, and 4B.

With reference to FIGS. 3A, 3B, 4A, and 4B, as the Al atoms moving through the second aluminum interconnect wire 4 toward the hole 5A adjacent the anode by the application of the stress current reaches the hole 5A, W atoms constituting the hole 5A and the components of the insulating film 7 interfere with the passage of the Al atoms in the hole 5a to prevent the Al atoms from escaping. Then, an internal stress (compressive stress) F1 is exerted in the backflow direction to draw the Al atoms adjacent the hole 5A back toward the hole 5K. The gradient of a potential caused by the internal stress F1 increases as the hole-to-hole spacing decreases. Thus, when the Blech length is reached, the movement of the Al atoms caused by an internal stress F2 and the movement I2 of the Al atoms caused by the stress current are saturated.

It has already been known that the relationship:

J•Lc=constant holds between a stress current density J and the critical interconnect wire length Lc.

In consideration for the backflow effect, setting the aluminum interconnect wire length of the hole chain to a value not greater than the critical interconnect wire length Lc may prevent the EM failure. In the actual semiconductor devices, however, the Al interconnect wire length takes variable values which are, in some cases, a maximum of on the order of millimeters. Thus, it is impossible to set each Al interconnect wire length to a value not greater than the Blech length Lc. The Al interconnect wire length at its maximum must be evaluated.

Consideration will be given to how the hole-to-hole spacings of the hole chain and the Al interconnect wire lengths should be controlled to exactly predict the EM failure lifetime.

The answer to the question is the characteristic structure of the present invention. The viewpoint of the characteristic structure of the present invention will be detailed below.

The EM lifetime of the hole chain is estimated using as the failure distribution the logarithmic normal distribution having two parameters: MTF (median time to failure) and standard deviation σ. The form of a function of the logarithmic normal distribution is:

$$f(t) = \frac{1}{\sigma t \sqrt{2\pi}} \exp\left(1 - \frac{(\log t - \log MTF)^2}{2\sigma^2}\right) \quad (1)$$

If it is possible to make the two parameters MTF and σ substantially constant independently of the Al interconnect wire length, constantly stable EM lifetime prediction should be enabled independently of the establishment of the structure of the hole chain. Thus, it is sufficiently significant to pursue an establishment range which may achieve such a result. From this point of view, I, the inventor, derived simulation expressions to be described below and performed the simulation.

First, the definition of the respective symbols for use in the expressions to be discussed below is indicated in Table 1.

TABLE 1

| variable | definition |
| --- | --- |
| Vc | volume of Al atoms moved before failure occurs |
| As | cross-sectional area of Al interconnect wire |
| vd | Al drift velocity |
| ve | Al atom movement velocity by electron flow |
| vb | movement velocity by backflow effect |
| k | Boltzmann's constant |
| T | temperature |
| D | diffusion constant |
| eZ* | effective charge of metal ion |
| ρ | metal resistivity |
| j | electric current density |
| L | Al interconnect wire length |
| Δσ | backflow stress |
| Ωa | atomic volume |
| B,B',C' | constants |

From Expression (4) disclosed in "A. S. Oates, IEEE International Reliability Physics Proceedings, pp. 164–171 (1996)", the MTF which is one of the hole chain parameters is expressed by $$MTF = \frac{Vc}{vd \cdot As} = \frac{B}{As \cdot (j - jc)} \quad (2)$$

The Al atom drift velocity vd is expressed by $$vd = ve - vb = \frac{D}{kT}\left(eZ^*\rho \cdot j - \frac{\Delta\sigma\Omega a}{L}\right) \quad (3)$$

Therefore, $$vd = \frac{D}{kT}eZ^*\rho\left(j - \frac{\Delta\sigma\Omega a}{eZ^*\rho} \cdot \frac{1}{L}\right) \quad (4)$$

$$= \frac{D}{kT}eZ^*\rho(j - jc)$$

$$\left(\text{where } jc = \frac{\Delta\sigma\Omega a}{eZ^*\rho} \cdot \frac{1}{L}\right)$$

If the Al interconnect wire length L is variable under constant stress current density J conditions, the following expression holds.

$$vd = \frac{D}{kT}eZ^*\rho \cdot j\left(1 - \frac{\Delta\sigma\Omega a}{eZ^*\rho j} \cdot \frac{1}{L}\right) \quad (5)$$

$$= \frac{D}{kT}eZ^*\rho \cdot j\left(1 - \frac{Lc}{L}\right)$$

$$\left(\text{where } Lc = \frac{\Delta\sigma\Omega a}{eZ^*\rho j}\right)$$

Comparison between Expression (4) and Expression (5) gives $$j - jc = j\left(1 - \frac{Lc}{L}\right) \quad (6)$$

Thus, the parameters MTF and σ are expressed respectively by $$MTF = \frac{B}{Asj} \cdot \frac{1}{\left(1 - \frac{Lc}{L}\right)} = B' \cdot \frac{1}{\left(1 - \frac{Lc}{L}\right)} \quad (7)$$

$$\sigma^2 = \frac{(\sigma As^2 / As^2)j^2}{(j - jc)^2} + \sigma_0^2 \quad (8)$$

$$= \frac{\sigma As^2 / As^2}{\left(1 - \frac{Lc}{L}\right)^2} + \sigma_0^2$$

$$= \frac{C'}{\left(1 - \frac{Lc}{L}\right)^2} + \sigma_0^2$$

The first equation in the first row of Expression (8) is derived from Expression (6) of the above described reference.

Figure 5:
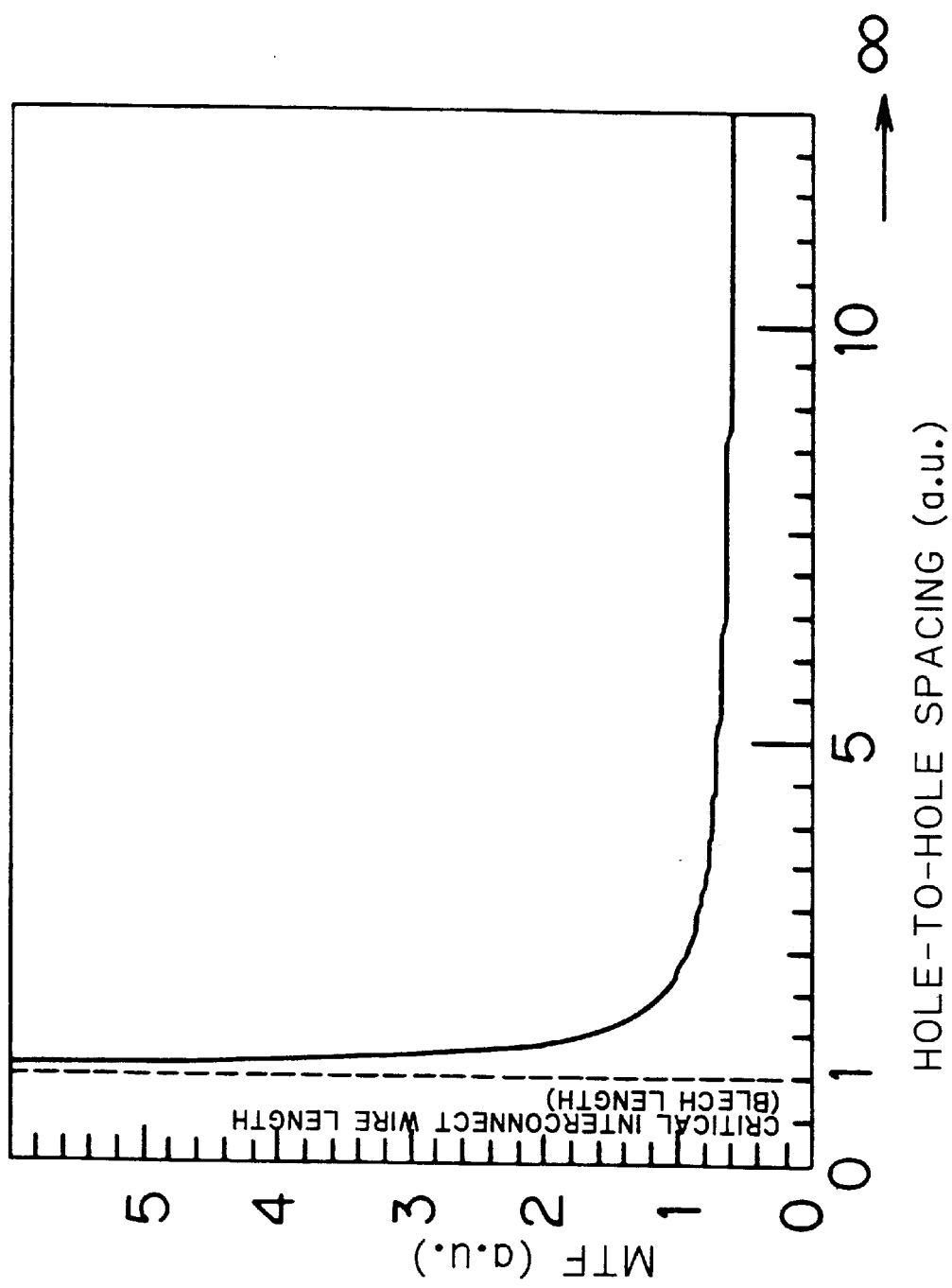
FIG. 5 schematically illustrates the dependence of a parameter MTF upon a hole-to-hole spacing.
Figure 6:
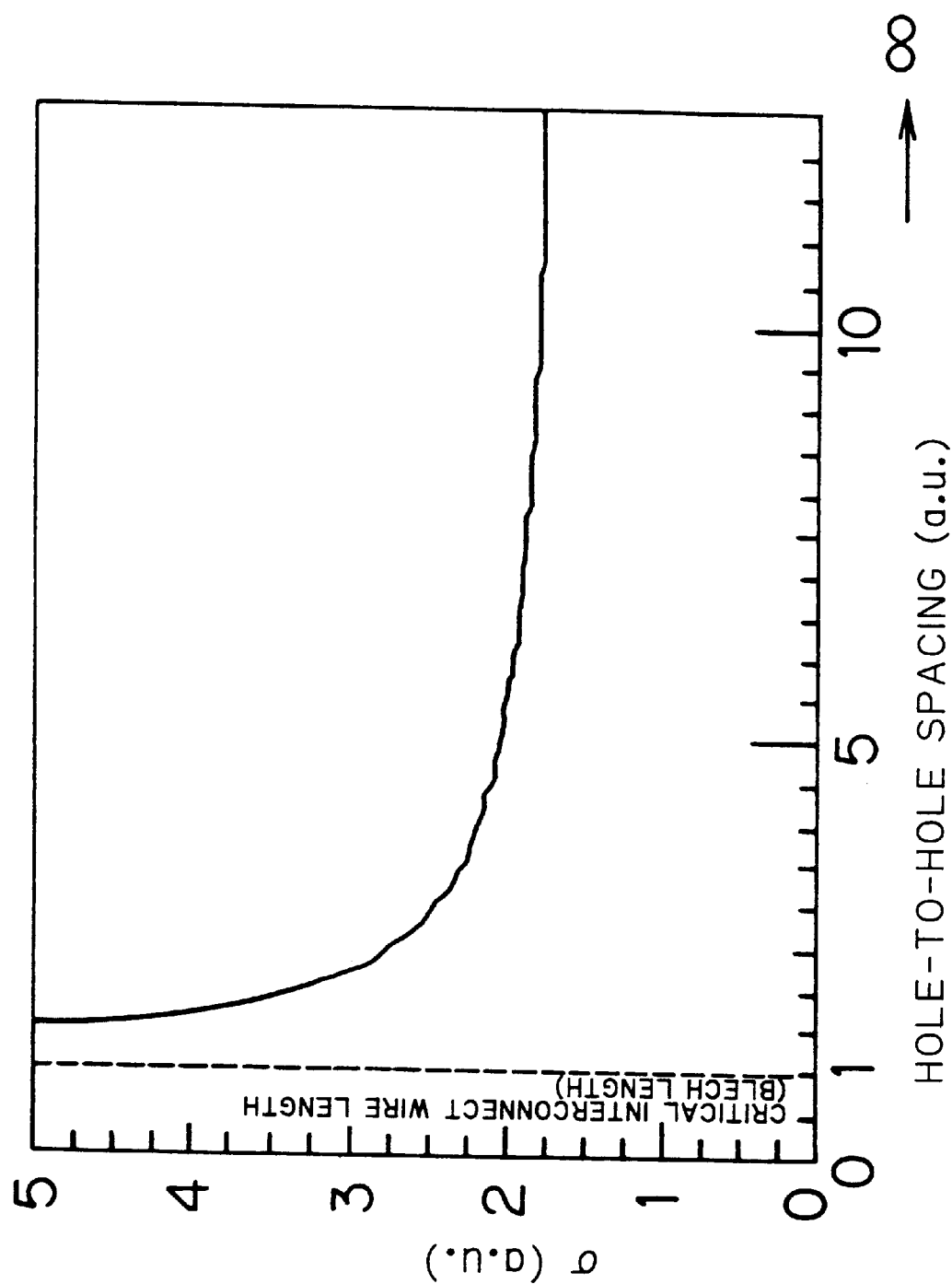
FIG. 6 illustrates the dependence of a parameter σ upon the hole-to-hole spacing.

The results of simulation of the parameters MTF and σ given by Expressions (7) and (8) using the hole-to-hole spacing (in arbitrary unit) and accordingly the Al interconnect wire length L as variables are illustrated in FIGS. 5 and 6, respectively.

The parameters MTF and σ are dependent upon the hole-to-hole spacing as illustrated in FIGS. 5 and 6, and increase due to the backflow effect if the hole-to-hole spacing is less than five times the critical interconnect wire length Lc. Conversely, the parameters MTF and σ are substantially constant if the hole-to-hole spacing is not less than five times the critical interconnect wire length Lc. Hence, it can be said that the hole-to-hole spacings of the hole chain must be set to not less than five times the critical interconnect wire length Lc to achieve the exact EM lifetime evaluation. Theoretically, the hole-to-hole spacings may be ∞.

As above described, setting the hole-to-hole spacings to not less than five times the critical interconnect wire length Lc results in the constantly fixed parameters σ and MTF independently of the lengths of the first and second Al interconnect wires, permitting stable lifetime prediction during the evaluation using the test structure of the first preferred embodiment. It should be noted that the critical interconnect wire length Lc is determined by the stress current density J to be applied.

The above-mentioned technical concepts are basically applicable when the "Weibull distribution" expressed by $$f(t) = \frac{m(t - t_0)^{m-1}}{k} \cdot \exp\left(\frac{-(t - t_0)^m}{k}\right) \quad (9)$$

is used as the failure distribution. In general, since the function form wherein the parameter m in Expression (9) is greater than 2 is used, the Weibull distribution is close to the normal distribution. Therefore, in this case, the range of the hole-to-hole spacings which permits the parameters $t_0$ and k in Expression (9) to be determined independently of the hole-to-hole spacings should be X times the Blech length (where X is a rational number greater than 1).

The subject of the first preferred embodiment is generally to set the hole-to-hole spacings of the hole chain to not less than X times the Blech length (where X is a rational number greater than 1). The value X times the Blech length is one value within the hole-to-hole spacing range which may be taken when all parameters of a predetermined failure distribution used for lifetime estimation of the hole chain in a predetermined failure mode are determined independently of the hole-to-hole spacings.

(Second Preferred Embodiment)

Figure 7A:
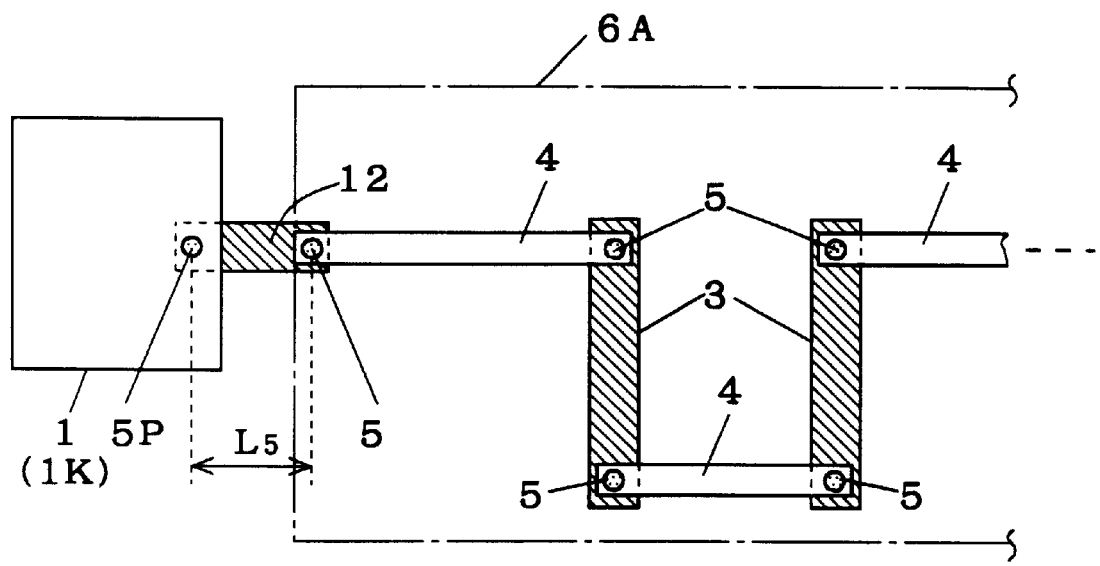
FIGS. 7A and 7B are plan views of one form of the test structure according to a second preferred embodiment of the present invention.

FIG. 7A is a schematic plan view of the test structure according to the second preferred embodiment of the present invention. The insulating film is not illustrated in FIG. 2 as in FIG. 1. The cross section of the test structure of FIG. 7A corresponds to FIG. 2. Like reference numerals and characters are used in FIG. 7A to designates elements identical with those of FIG. 1. However, in the second preferred embodiment, the lengths of the first and second Al interconnect wires 3 and 4 (that is, the hole-to-hole spacings) may take any value and are not subject to the limitation of the first preferred embodiment. Thus, the structure of a hole chain 6A is similar to that of the background art. The reference character 5P designates a via hole comprised of a tungsten plug in the insulating film on the lower surface of the pad 1 for electrically connecting the pad 1 and an extension interconnect wire 12. The diagonally shaded portions of FIG. 7A indicate lower Al interconnect wires. The second preferred embodiment features the structure of the extension interconnect wire 12.

With the evaluation stress current applied from the exterior, a part of the extension interconnect wire 12 must be established so that the Al atoms are not moved by the EM. As detailed in the first preferred embodiment, the backflow effect may prevent the EM failure when the Al interconnect wire length is set to not greater than the Blech length. This may be applied to the extension interconnect wire 12.

In the hole chain of the second preferred embodiment, the extension interconnect wire 12 having a longitudinal length (center-to-center spacing between the holes 5 and 5P) $L_5$ which is not greater than the critical interconnect wire length Lc determined by the stress current density J on the basis of the above described relationship is connected to one end of the pad 1 (which is connected to the hole 5P) and one end of the hole chain 6A to be evaluated. That is, $L_5 \leq Lc$ holds.

Figure 7B:
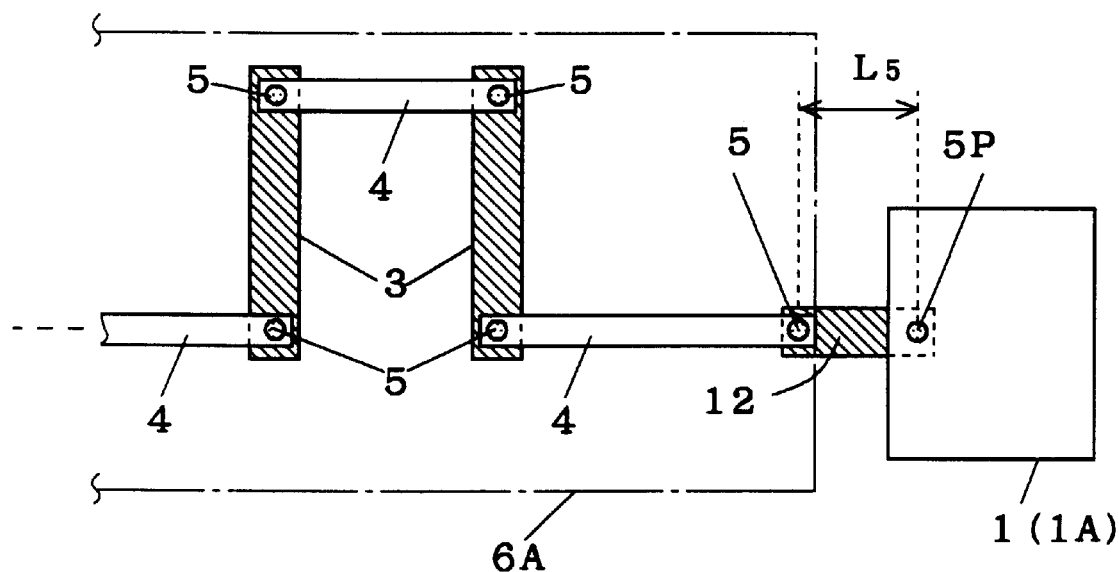

It should be noted that the other pad 1 (1A) and the other end of the hole chain 6A, which are shown in FIG. 7B, are also connected to each other through the extension interconnect wire 12.

Evaluation using the EM evaluation test structure may prevent lifetime estimation errors due to the EM failure in the extension interconnect wire 12, allowing exact EM lifetime prediction for the hole chain structure.

(Third Preferred Embodiment)

The third preferred embodiment of the present invention is a first application of the second preferred embodiment.

Figure 8A:
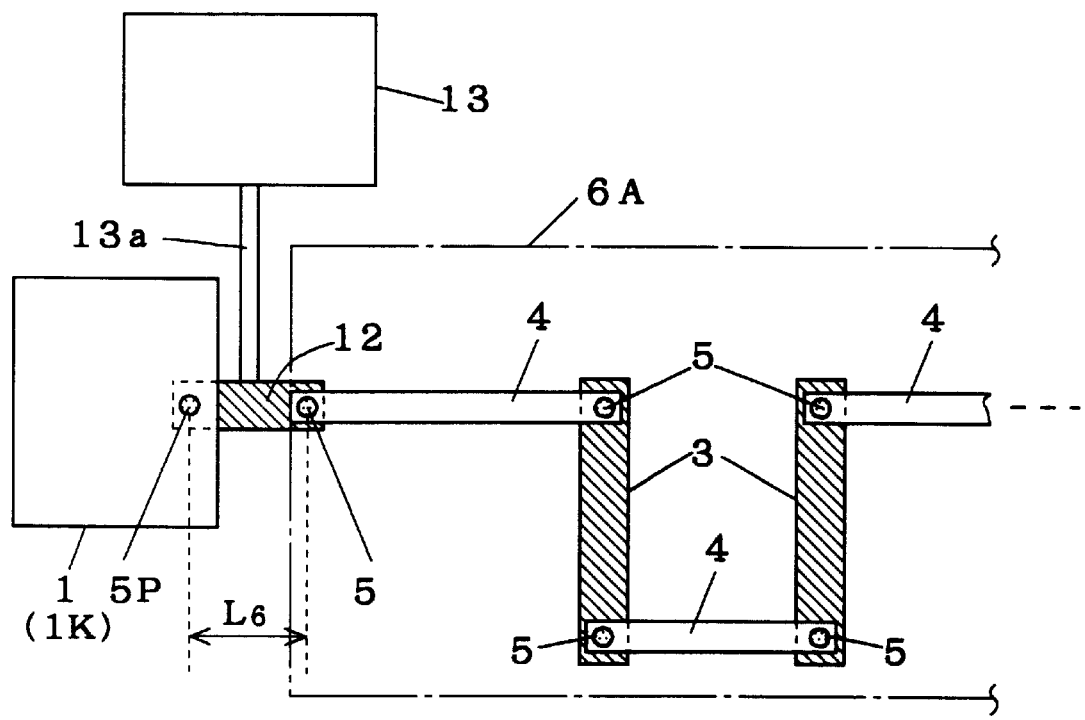
FIGS. 8A and 8B are schematic plan views of the test structure according to a third preferred embodiment of the present invention.
Figure 8B:
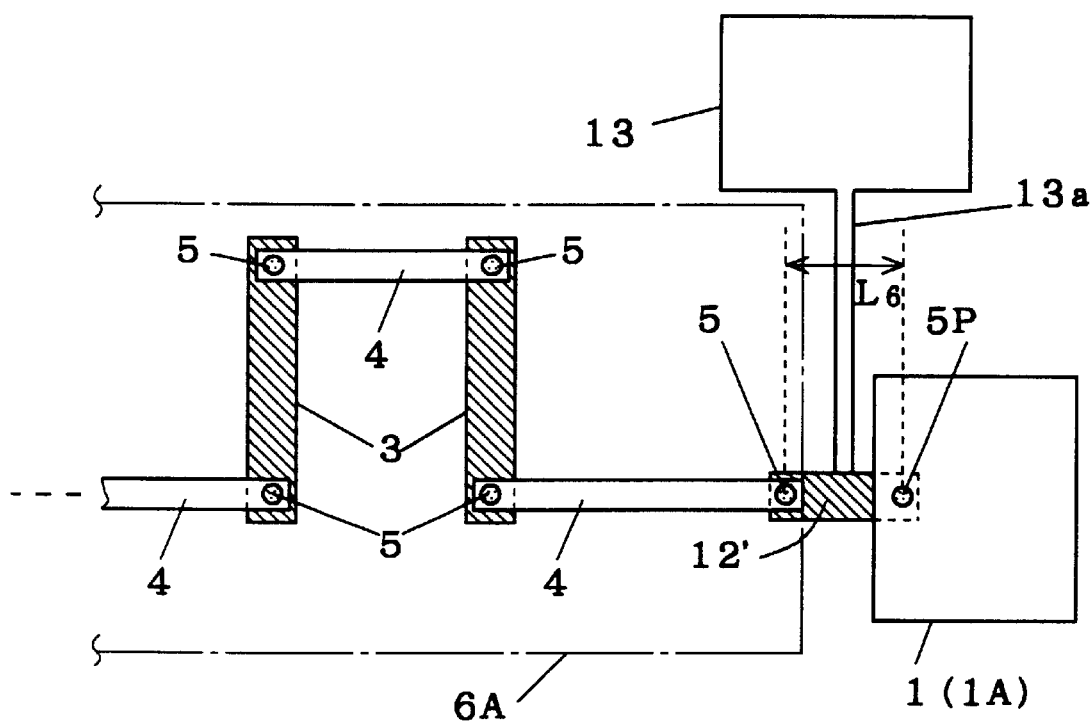

FIGS. 8A and 8B are schematic plan views similar to FIG. 1 for illustrating the test structure according to the third preferred embodiment of the present invention. Like reference numerals and characters are used in FIGS. 8A and 8B to designate elements identical with those of FIGS. 7A and 7B. The structure of FIG. 8A differs from that of FIG. 7A in that a resistance measuring monitor terminal 13 for measuring the resistance of the hole chain is connected to the extension interconnect wire 12 having the length set to not greater than the critical interconnect wire length Lc. The terminal 13 is connected at its surface part which is not covered with the insulating film 7 (FIG. 2) to an external resistance measurement equipment not shown. The terminal 13 is connected to the extension interconnect wire 12' which connects the other pad (1A: Anode) to the other end of the hole chain 6A. Such a structure may solve the background art problems.

In the background art test structure in which the length of the extension interconnect wire is not suitably set (and such viewpoint is lacking), the application of stress current creates voids in parts of the extension interconnect wire. Connecting a monitor terminal to the part of the extension interconnect wire causes Al atoms to be fed by diffusion from an extension interconnect wire of the monitor terminal itself toward the extension interconnect wire for connecting the hole chain and the pad, resulting in overestimate of the EM lifetime. However, the structure of the third preferred embodiment prevents the creation of voids in the extension interconnect wire 12 to eliminate the supply of the Al atoms from a monitor terminal extension interconnect wire 13a. This prevents (1) the above described problem and (2) estimation errors due to failure of a pad connecting portion, allowing exact EM lifetime prediction.

It should be noted that the extension interconnect wire 13a has the construction of the lower Al interconnect wires in the arrangement of FIG. 8A.

(Fourth Preferred Embodiment)

The fourth preferred embodiment of the present invention is a second application of the second preferred embodiment, and makes improvements to the pad 1. Thus, the fourth preferred embodiment has the intact structures of the hole chain 6A and the extension interconnect wire 12 of the second preferred embodiment.

Figure 9:
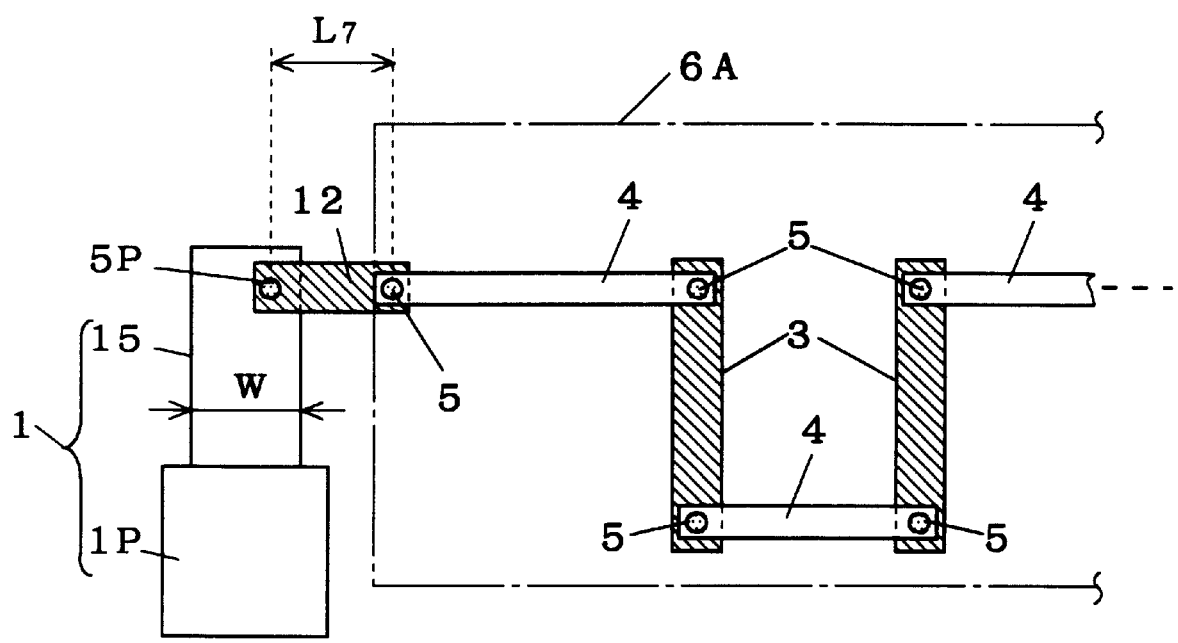
FIG. 9 is a schematic plan view of the test structure according to a fourth preferred embodiment of the present invention.

FIG. 9 is a schematic plan view of the test structure according to the fourth preferred embodiment. The insulating film is not illustrated in FIG. 9 as in FIG. 1. The cross section of the structure of FIG. 9 corresponds to FIG. 2. Like reference numerals and characters are used in FIG. 9 to designate elements identical with those of FIG. 7A. Therefore, $L_7 \leq Lc$.

The pad 1 comprises (1) a pad portion 1P electrically connected to an external power supply (not shown) and receiving stress current supply, and (2) an extension interconnect wire portion 15 extending from a part of the pad portion 1P toward one end of the extension interconnect wire 12 (which is connected to the hole 5P). The extension interconnect wire portion 15 has a width W sufficiently wide so that the EM failure is not caused therein, and is of any length.

The formation of the extension interconnect wire portion 15 as a part of the pad 1 permits highly flexible layout and efficient utilization of a semiconductor wafer. Off course, exact EM lifetime prediction is achieved.

Supplementary explanation is given on the highly flexible layout. In terms of layout, the pad portion 1P has an area in proportions much greater than that of the hole chain. For example, the extension interconnect wire 12 has a length of several micrometers, but each side of the pad portion 1P is 140 to 150 micrometers in size which is about 100 times greater than the length the extension interconnect wire 12. Thus, how to locate the pad portion 1P efficiently is significant in terms of layout. In particular, when a plurality of hole chains are formed on the same Si substrate, the sharing of the pad 1 adjacent the cathode between the hole chains is convenient. If the pad 1 of FIG. 9 is applied to the pad adjacent the cathode, the respective hole chains may commonly use the pad 1, permitting reduction in the number of pads having a large share of the area, as schematically illustrated in the plan view of FIG. 10.

Figure 10:
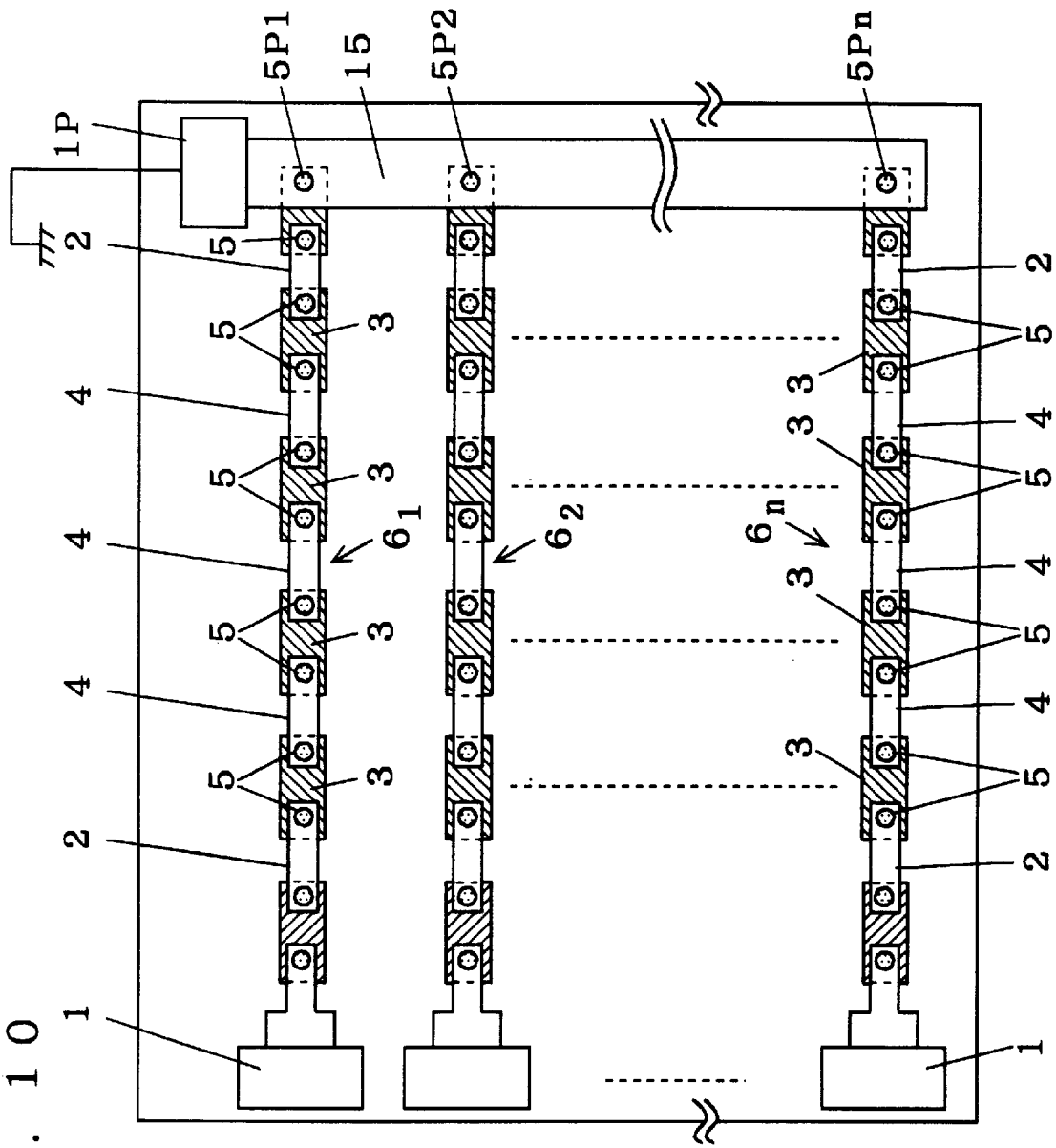
FIG. 10 is a schematic plan view of an application of the fourth preferred embodiment.

Referring to FIG. 10, n hole chains $6_1$ to $6_n$ are formed on a silicon substrate and share the ground pad portion 1P through the connections to the extension interconnect wire portion 15. In this manner, the pad portion 1P requiring a large area may be located in one end portion on the substrate. This is advantageous in terms of layout.

(Fifth Preferred Embodiment)

The fifth preferred embodiment of the present invention is a third application of the second preferred embodiment. The principal feature of the fifth preferred embodiment is a plurality of extension interconnect wires, that is, first and second extension interconnect wires.

Figure 11:
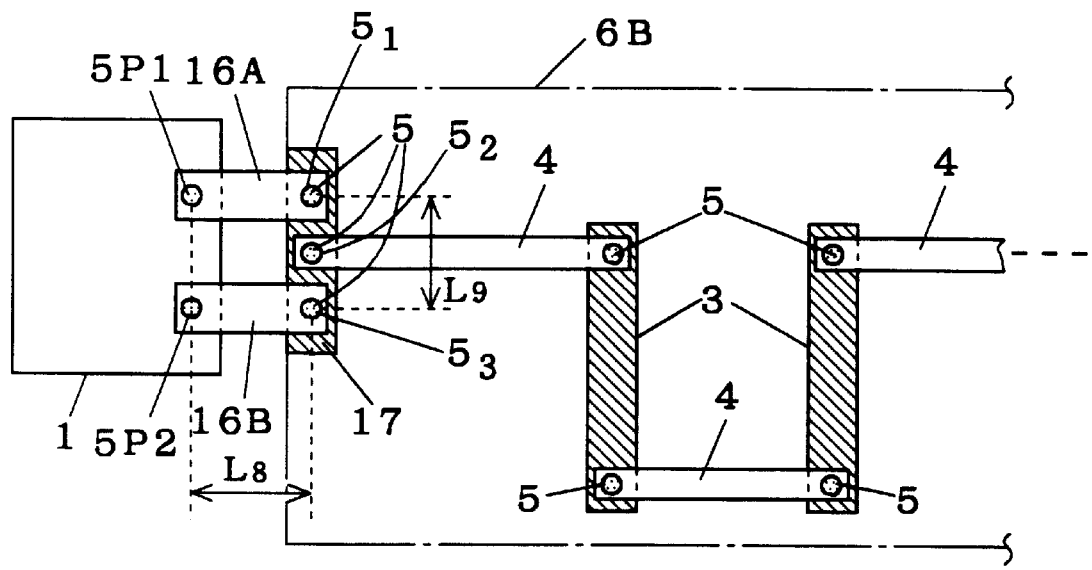
FIG. 11 is a schematic plan view of the test structure according to a fifth preferred embodiment of the present invention.

FIG. 11 is a schematic plan view of the test structure according to the fifth preferred embodiment. The cross section of the structure of FIG. 11 corresponds to FIG. 2. Like reference numerals and characters are used in FIG. 11 to designate elements identical with those of FIG. 7A. The diagonally shaded portions of FIG. 11 denote the lower Al interconnect wires.

In the fifth preferred embodiment, a plurality of extension interconnect wires are provided each having a length $L_8$ which is not greater than the critical interconnect wire length Lc. Specifically, provided are a first extension interconnect wire 16A connected at its first end to a first end of the pad 1 through a hole 5P1, and a second extension interconnect wire 16B connected at its first end to the first end of the pad 1 through a hole 5P2. The first extension interconnect wire 16A has a second end connected to a first end portion of a lower interconnect wire 17 through a hole 5 (corresponding to a first hole $5_1$). Similarly, the second extension interconnect wire 16B has a second end connected to a second end portion of the interconnect wire 17 through a hole 5 (corresponding to a third hole $5_3$). The interconnect wire 17 has a length $L_9$ which is not greater than the critical interconnect wire length Lc, and is connected at its middle portion to a first end of the upper second Al interconnect wire 4 through a contact or via hole 5 (corresponding to a second hole $5_2$). The first end of the second Al interconnect wire 4, the interconnect wire 17, and the first to third holes $5_1$ to $5_3$ are defined as a "first end of a hole chain 6B". The center-to-center spacing $L_9$ between the first and third holes $5_1$ and $5_3$ is not greater than the Blech length. These holes $5_1$ to $5_3$ may be seen as being connected to other holes in sequential order through the second hole $5_2$, and as being electrically connected to each other.

The provision of the plurality of extension interconnect wires 16A and 16B in this fashion decreases the current density of the respective extension interconnect wires to increase the stress current applied to the pad 1 by several times, permitting the evaluation under high stress current conditions. Since the lengths of the extension interconnect wires 16A and 16B and the interconnect wire 17 are not greater than the Blech length Lc, the use of the EM evaluation test structure achieves exact EM lifetime prediction of the hole chain structure.

(Sixth Preferred Embodiment)

The sixth preferred embodiment of the present invention comprises the features of the third preferred embodiment added to the features of the fifth preferred embodiment. That is, the sixth preferred embodiment is characterized in that the resistance measuring monitor terminal is connected to one of the plurality of extension interconnect wires through its extension interconnect wire. The extension interconnect wire connected to the monitor terminal is defined as a "first extension interconnect wire" corresponding to the extension interconnect wire 16A of FIG. 12.

Figure 12:
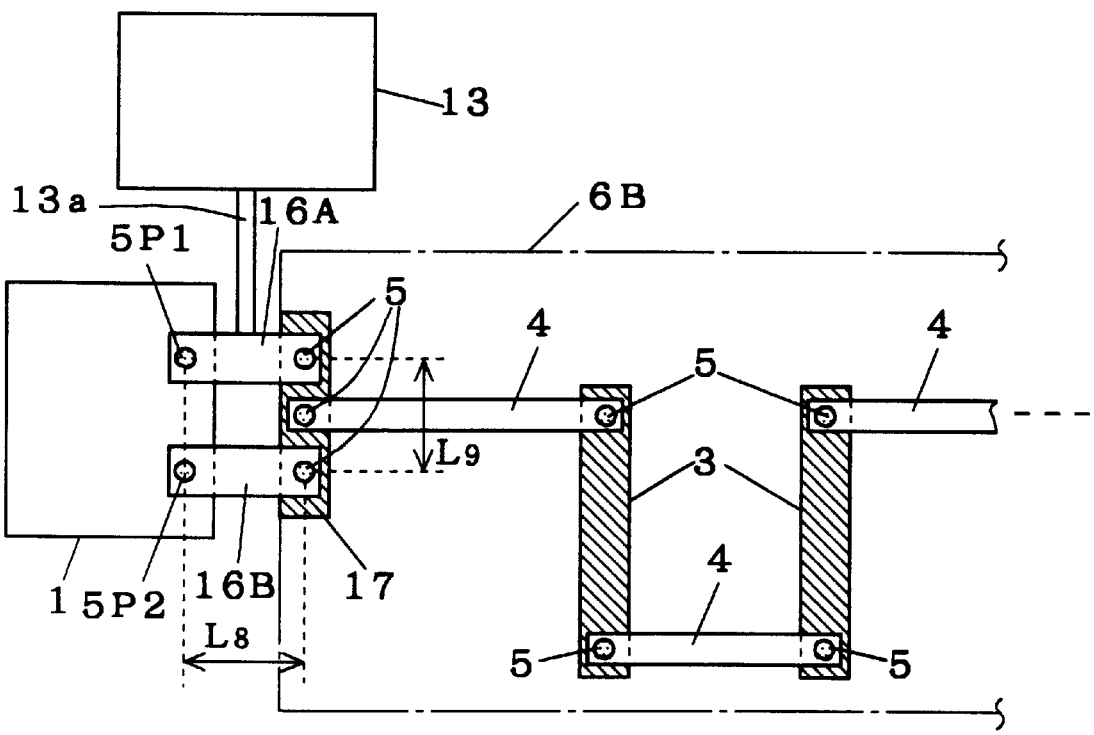
FIG. 12 is a schematic plan view of the test structure according to a sixth preferred embodiment of the present invention.

FIG. 12 is a schematic plan view of the test structure according to the sixth preferred embodiment. Like reference numerals and characters are used in FIG. 12 to designate elements identical with those of FIGS. 8A and 11. As illustrated in FIG. 12, the length $L_8$ of the extension interconnect wires 16A and 16B is not greater than the critical interconnect wire length Lc, and the resistance measuring monitor terminal 13 is connected to the extension interconnect wire 16A.

Thus, (1) the connection of the resistance measuring monitor terminal 13 to the extension interconnect wire 16A completely prevents the EM lifetime from being overestimated because of Al atom supply from the extension interconnect wire 13a of the monitor terminal, and (2) exact EM lifetime prediction and evaluation under high stress current conditions are accomplished as in the fifth preferred embodiment.

(Seventh Preferred Embodiment)

The seventh preferred embodiment of the present invention comprises the features of the fourth preferred embodiment added to the features of the fifth preferred embodiment. Specifically, the pad includes the pad portion and the extension interconnect wire portion electrically connected to respective one end of the plurality of extension interconnect wires which is adjacent the pad.

Figure 13:
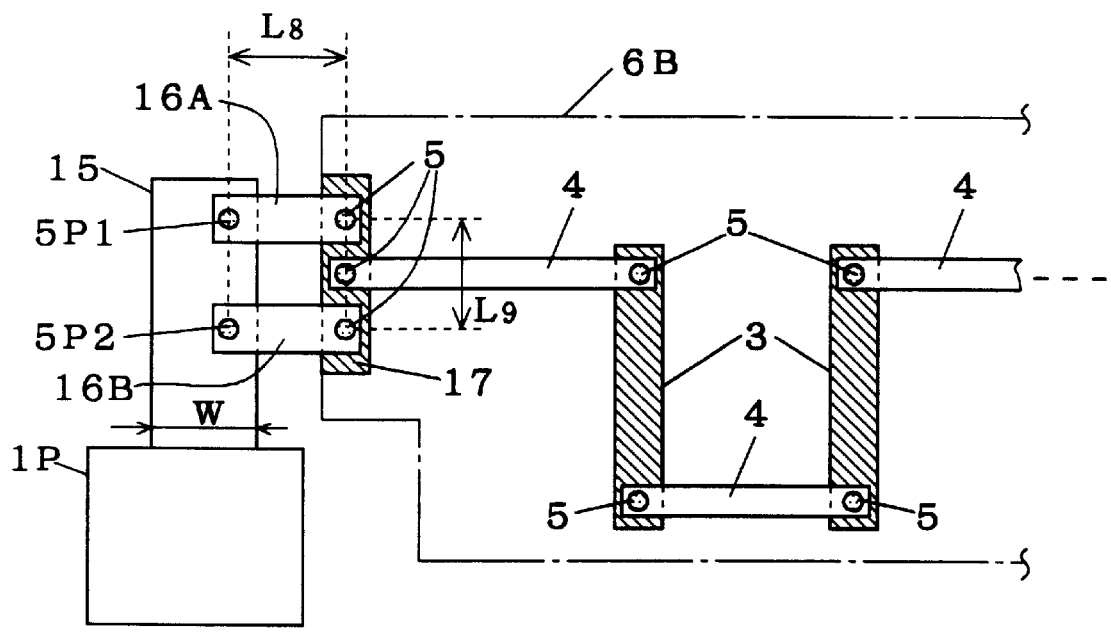
FIG. 13 is a schematic plan view of the test structure according to a seventh preferred embodiment of the present invention.

FIG. 13 is a schematic plan view of the test structure according to the seventh preferred embodiment. Like reference numerals and characters are used in FIG. 13 to designate elements identical with those of FIGS. 9 and 11.

Referring to FIG. 13, the extension interconnect wire 15 extending from the pad portion 1P and having a width W sufficiently wide so that the EM failure is not caused is electrically connected to the plurality of extension interconnect wires 16A and 16B having a length $L_8$ which is not greater than the critical interconnect wire length Lc through the contact or via holes 5P1 and 5P2.

This permits (1) highly flexible layout establishment as in the fourth preferred embodiment to allow efficient utilization of the semiconductor wafer, and (2) exact EM lifetime prediction and evaluation under high stress current conditions as in the fifth preferred embodiment.

(Modifications)

Figure 14:
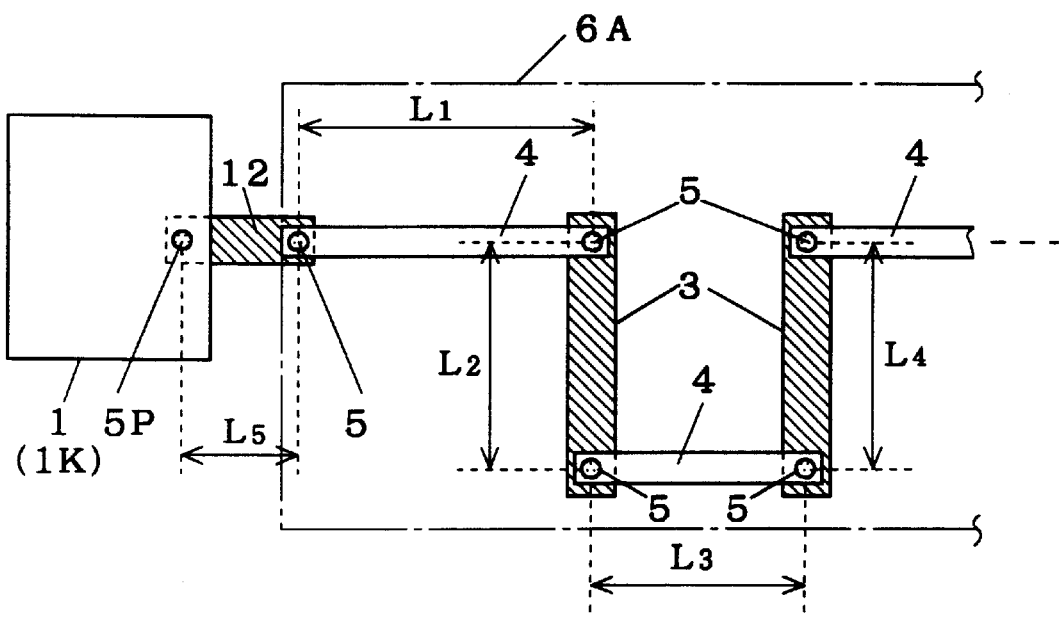
FIG. 14 is a schematic plan view of a modification of the test structure of the second preferred embodiment.

In the second to seventh preferred embodiments, the hole-to-hole spacings in the hole chain (6B) are of any length. Instead, the hole-to-hole spacings may be set to not less than five times the Blech length as in the first preferred embodiment. For instance, FIGS. 14 and 15 are plan views of modifications of the second and seventh preferred embodiments, respectively. Referring to FIGS. 14 and 15, the lengths $L_1$, $L_2$, $L_3$, and $L_4$ are set to certain values not less than five times the Blech length. This provides the effects of the first preferred embodiment in addition to the effects of a corresponding one of the second to seventh preferred embodiments, achieving more exact and stabler EM lifetime prediction.

While the invention has been described in detail, the foregoing description is in all aspects illustrative and not restrictive. It is understood that numerous other modifications and variations can be devised without departing from the scope of the invention.

I claim:

1. A device used in evaluating reliability of interconnect wires comprising:

a substrate;

an insulating film formed on said substrate; and a hole chain formed in said insulating film and comprising a plurality of holes electrically connected in sequential order by interconnection segments;

wherein a center-to-center distance between adjacent holes of said plurality of holes is not less than x times a Blech length, where x is a rational number greater than 1; and wherein said center-to-center distance corresponds to one value falling within a range of hole-to-hole spacings, when all parameters of a predetermined failure distribution, used for lifetime estimation of said hole chain in a predetermined failure mode and indicated in the form of a function using said hole-to-hole spacings as variables, are determined independently of said hole-to-hole spacings.

2. The device in accordance with claim 1, wherein said predetermined failure mode corresponds to an electromigration failure.

3. The device in accordance with claim 2, wherein said predetermined failure distribution is a logarithmic normal distribution, and wherein said center-to-center distances between said holes of said hole chain are not less than five times said Blech length.

4. A device used in evaluating reliability of interconnect wires comprising:

a substrate;

an insulating film formed on said substrate;

a pad formed in said insulating film and partially exposed;

a hole chain formed in said insulating film and comprising a plurality of holes electrically connected in sequential order by interconnection segments; and an extension interconnect wire formed in said insulating film for establishing an electrical connection between said pad and a first end of said hole chain which is adjacent said pad;

wherein a length of said extension interconnect wire is not greater than a Blech length.

5. The device in accordance with claim 4, further comprising:

a resistance measuring monitor terminal formed in said insulating film and partially exposed, said resistance measuring monitor terminal being connected to said extension interconnect wire.

6. The device in accordance with claim 4, wherein said extension interconnect wire corresponds to a first extension interconnect wire, said device further comprising a second extension interconnect wire formed in said insulating film for establishing an electrical connection between said pad and said first end of said hole chain, said second extension interconnect wire having a length which is not greater than said Blech length.

7. The device in accordance with claim 6, further comprising:
   a resistance measuring monitor terminal formed in said insulating film and partially exposed, said resistance measuring monitor terminal being connected to said first extension interconnect wire.

8. The device in accordance with claim 6,
   wherein said first end of said hole chain comprises first, second, and third holes electrically connected to each other,
   wherein a center-to-center spacing between said first and third holes is not greater than said Blech length,
   wherein said first and third holes are electrically connected to said first and second extension interconnect wires, respectively, and
   wherein said second hole is electrically connected to other ones of said plurality of holes constituting said hole chain in sequential order.

9. The device in accordance with claim 4,
   wherein said pad comprises:
      a pad portion receiving a stress current from the exterior; and
      an extension interconnect wire portion extending from a part of said pad portion and electrically connected to a first end of said extension interconnect wire which is adjacent said pad; and
   wherein said extension interconnect wire portion has a width set so that an electromigration failure is not caused due to said stress current.

10. The device in accordance with claim 6,
    wherein said pad comprises:
       a pad portion receiving a stress current from the exterior; and
       an extension interconnect wire portion extending from a part of said pad portion and electrically connected to respective first ends of said first and second extension interconnect wires which are adjacent said pad;
    wherein said extension interconnect wire portion has a width set so that an electromigration failure is not caused due to said stress current.

11. The device in accordance with claim 4,
    wherein a center-to-center spacing between adjacent ones of said holes of said hole chain is not less than five times said Blech length.

12. A device used in evaluating reliability of interconnect wires comprising:
    a substrate;
    an insulating film formed on said substrate;
    a hole chain formed in said insulating film and comprising a plurality of holes electrically connected in sequential order by interconnection segments;
    a pad; and
    an extension interconnect wire for establishing an electrical connection between said pad and a first end of said hole chain which is adjacent to said pad;
    wherein a length of said extension interconnect wire is not greater than a Blech length; and
    wherein a center-to-center spacing between adjacent ones of said holes is greater than said Blech length.

* * * * *